(12) United States Patent
Kella et al.

(10) Patent No.: US 11,206,738 B2
(45) Date of Patent: Dec. 21, 2021

(54) METHOD AND APPARATUS FOR FORMING ON A SUBSTRATE A PATTERN OF A MATERIAL

(71) Applicant: HP INDIGO B.V., Amstelveen (NL)

(72) Inventors: Dror Kella, Ness Ziona (IL); Eyal Negreanu, Ness Ziona (IL); Gideon Amir, Ness Ziona (IL); Mark Sandler, Ness Ziona (IL); Yaron Grinwald, Ness Ziona (IL)

(73) Assignee: HP Indigo B.V., Amstelveen (NL)

( * ) Notice: Subject to any disclaimer, the term of this patent is extended or adjusted under 35 U.S.C. 154(b) by 0 days.

(21) Appl. No.: 16/710,615

(22) Filed: Dec. 11, 2019

(65) Prior Publication Data

US 2020/0163222 A1 May 21, 2020

Related U.S. Application Data

(63) Continuation of application No. 14/436,829, filed as application No. PCT/EP2012/071638 on Oct. 31, 2012, now Pat. No. 10,588,221.

(51) Int. Cl.
*H05K 3/00* (2006.01)
*G03G 15/00* (2006.01)
(Continued)

(52) U.S. Cl.
CPC .......... *H05K 3/207* (2013.01); *G03G 15/24* (2013.01); *G03G 15/6585* (2013.01); *G03G 15/6591* (2013.01); *H05K 3/1266* (2013.01); *H05K 2203/0517* (2013.01); *H05K 2203/0522* (2013.01); *H05K 2203/0528* (2013.01)

(58) Field of Classification Search
None
See application file for complete search history.

(56) References Cited

U.S. PATENT DOCUMENTS 4,775,439 A 10/1988 Seeger, Jr. et al.
5,045,141 A * 9/1991 Salensky ............... H05K 3/207
156/240
(Continued)

FOREIGN PATENT DOCUMENTS

CN 101036424 A 9/2007
CN 101102645 A 1/2008
(Continued)

OTHER PUBLICATIONS

ZHE; "Research on the Process and Application of Ink-jet Printer in Water Transfer Printing"; http://en.cnki.com.cn/Article_en/CJFDTOTAL-SXHG200901033.htm ; 2009.

*Primary Examiner* — Jacob T Minskey
*Assistant Examiner* — Matthew Hoover
(74) *Attorney, Agent, or Firm* — Fabian VanCott

(57) ABSTRACT

In a method and an apparatus for forming on a substrate (214) a pattern of a material, a material layer is provided on an intermediate carrier (204) and an adhesive layer is provided on the material layer, wherein at least one of the material layer or the adhesive layer comprises a pattern corresponding to the pattern to be formed on the substrate (214). The material is transferred to the substrate (214) with the adhesive fixing the material to a surface (216) of the substrate (214).

20 Claims, 11 Drawing Sheets

(51) Int. Cl.
    *H05K 3/20*         (2006.01)
    *H05K 3/12*         (2006.01)
    *G03G 15/24*      (2006.01)

(56) References Cited

U.S. PATENT DOCUMENTS

| | | |
|---|---|---|
| 5,591,290 A | 1/1997 | Walter |
| 5,866,220 A | 2/1999 | Rusincovitch |
| 6,207,268 B1 | 3/2001 | Kosaka et al. |
| 2005/0009327 A1 | 1/2005 | Yoshida |
| 2006/0072944 A1* | 4/2006 | Sharma ............... G03G 15/224 |
| | | 399/308 |
| 2006/0159838 A1 | 7/2006 | Kowalski |
| 2010/0104336 A1 | 4/2010 | Christopher |
| 2010/0294155 A1 | 11/2010 | Hunahata |

FOREIGN PATENT DOCUMENTS

| | | |
|---|---|---|
| CN | 101420064 A | 4/2009 |
| CN | 102452239 A | 5/2012 |
| EP | 0148601 A2 | 7/1985 |
| JP | 2009028943 A | 2/2009 |
| JP | 2011238837 | 11/2011 |
| WO | WO-9940760 | 8/1999 |

* cited by examiner

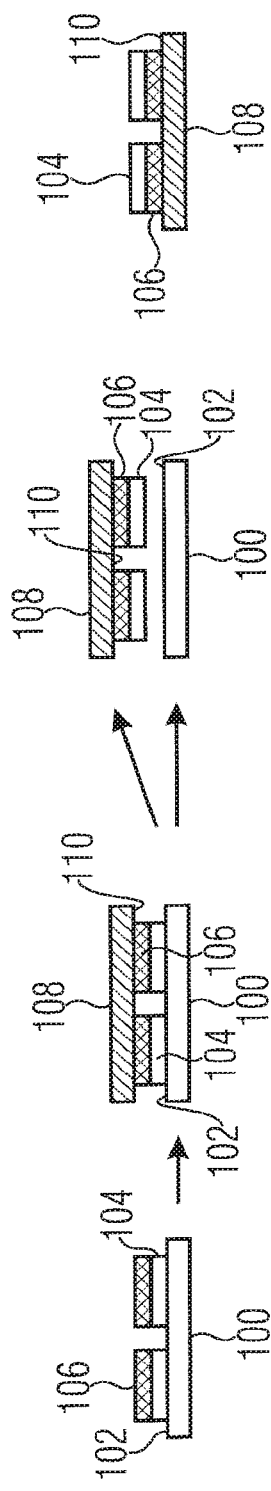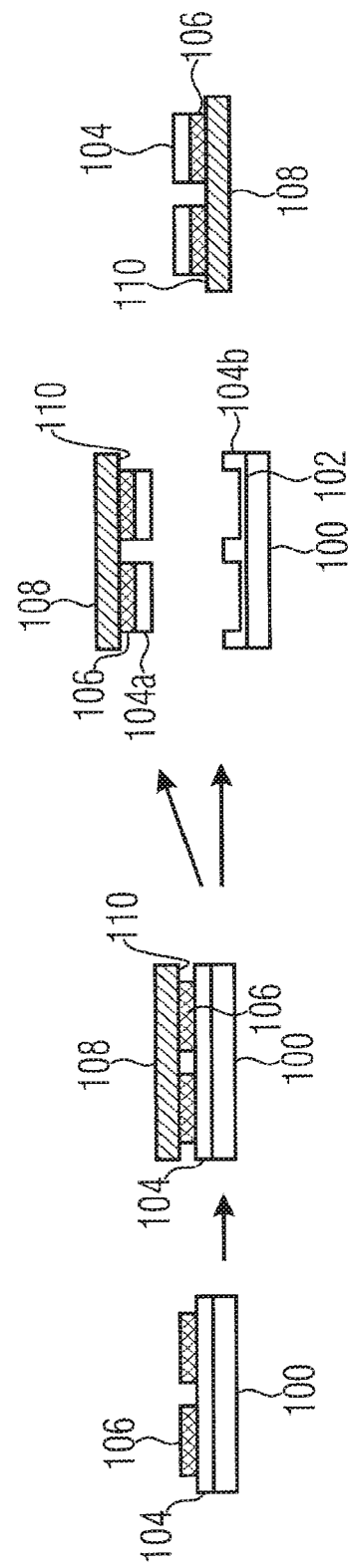

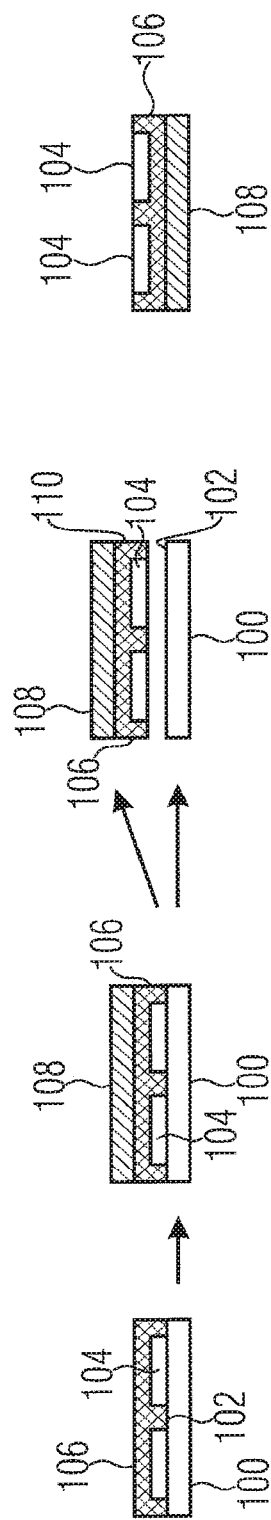
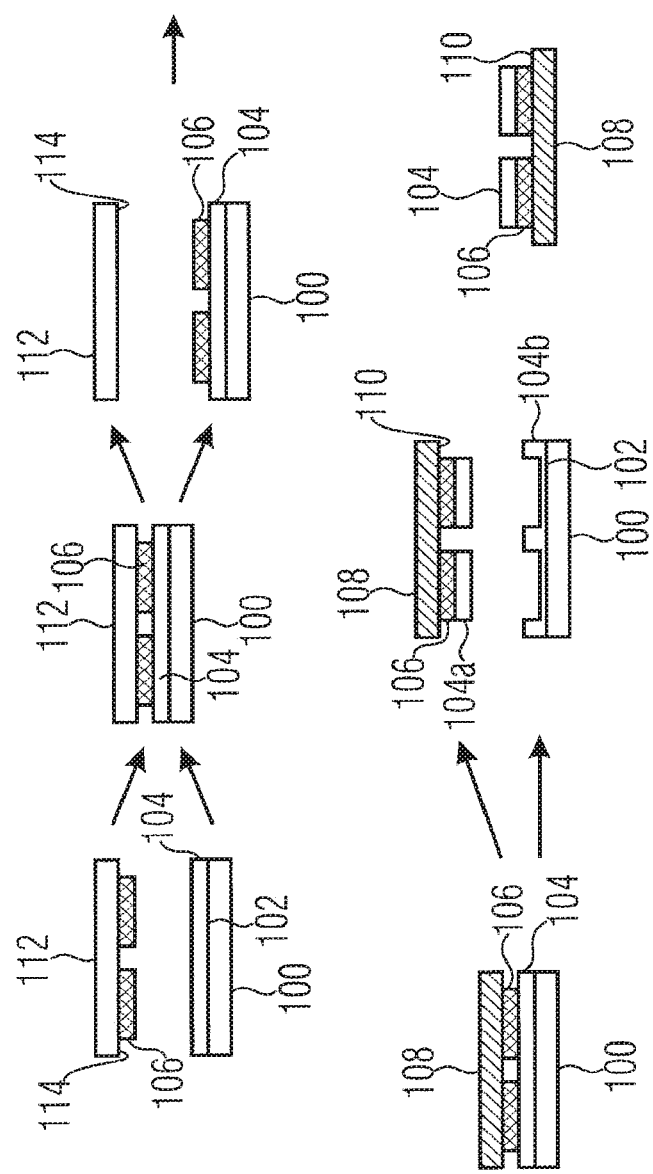
FIGURE 3C
FIGURE 3D

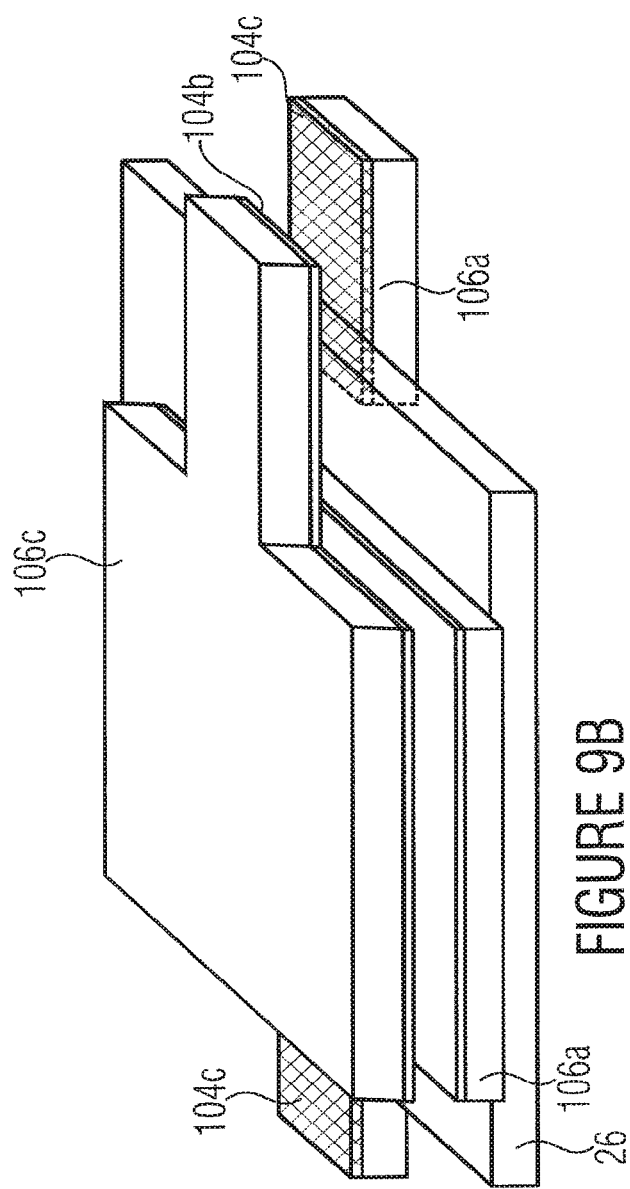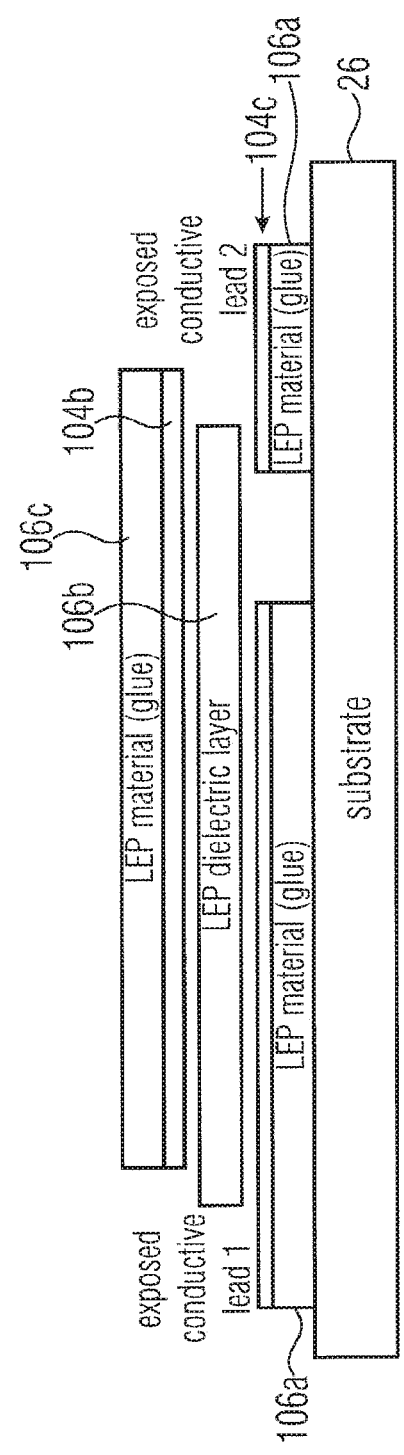

METHOD AND APPARATUS FOR FORMING ON A SUBSTRATE A PATTERN OF A MATERIAL

BACKGROUND

For providing a pattern or an image of a material, for example a conductive material, on a substrate to form, for example, conductor traces, the material may be treated in such a way that it can be printed onto the substrate directly and after printing shows sufficient adherence properties with regard to the substrate so that the pattern is fixed to the substrate.

DESCRIPTION OF THE DRAWINGS

FIGS. 3A-3D show various examples for transferring a material with a desired pattern to a substrate when applying a method as described in FIG. 2;

FIGS. 9A-9B each show an example of a multi-layer functional device made by the printing engine described with respect to FIG. 7.

DETAILED DESCRIPTION

Figure 1:
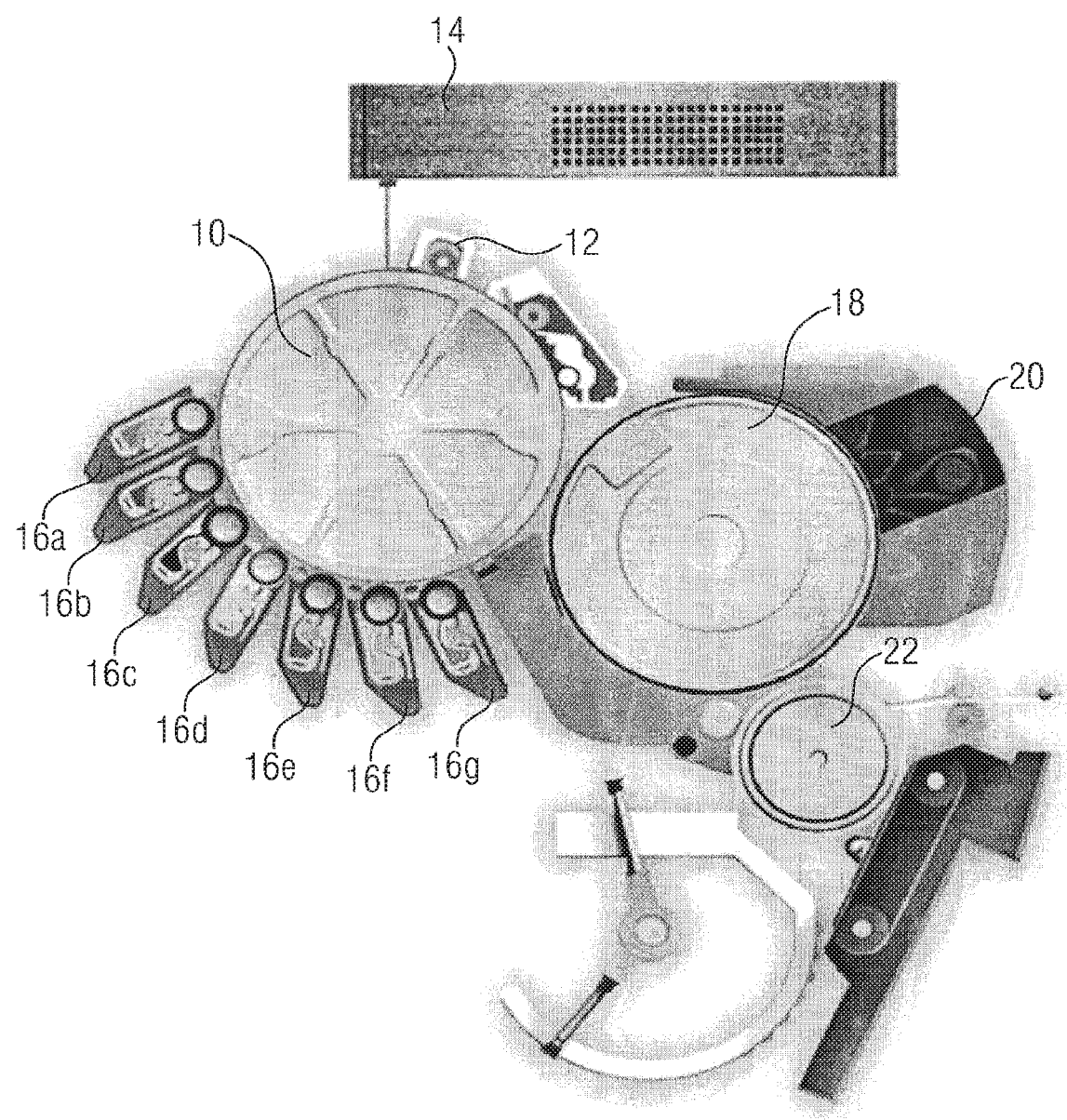
FIG. 1 is a schematic diagram of an LEP (Liquid Electro Photography) print engine.

For a variety of substrates it may be desired to apply to a surface thereof a material having a predefined pattern. For example, in the field of electronics it may be desired to provide a conductor pattern of an electric circuit on a substrate. In the field of printing, for example brochures, it may be desired to apply to a portion of the brochure or to pages thereof a material for obtaining a desired decorative effect. Other products may be also desired to be provided with a patterned material to obtain a decorative effect, for example greeting cards or the like may be provided with metallic materials to provide for a glittering effect when light is incident.

For providing patterns on a substrate analog and digital approaches may be used, such as inkjet printing, LEP (Liquid Electro Photography) printing, and thy EP (Electro Photographic) printing. These techniques allow precisely forming the desired pattern on the substrate by "printing" the material. The material needs to be "printable" by the respective technique, and has a sufficient adherence property with regard to the substrate to which it is to be applied so that it remains fixed on the substrate after the printing process.

Unfortunately, not all of the materials which are desired to be provided in a specific pattern on a substrate show such properties. A material may be not printable and/or may not show a sufficient adherence property with regard to the substrate to which it is to be applied. Thus, even in a case where the material could be printed, it may not sufficiently adhere to the substrate after being printed. Some materials that can be printed may be modified, for example by including a polymer to create an adhesive film during printing, to have sufficient adherence property, this may not be possible or desired for all materials as the original material, on the basis of which the pattern is to be formed, needs to be modified. This, in addition to the additional labor needed for modifying the material, may also effect the appearance and/or a property of the material after being applied to the substrate which may not be identical to the original appearance/property, for example in terms of conductivity, or in terms of the decorative effect to be achieved.

In other words, printing processes are limited by the range of materials they can print. As an example, when inkjet printing materials with large or heavy particles, for example flakes, these particles tend to sink in the ink. When LEP (Liquid Electro-Photography) and DEP (Dry Electro Photography) printing high-conductance materials, these conductive particles in the LEP or Dry-EP presses will short the gap between the electrodes, and will discharge, thereby preventing their ability for material transfer. Moreover, printing of a new material by a printing process may require high investment for the development of new ink. In addition, the printed material may be typically mixed with a carrier material, which might affect its functionality or require a post-printing process to remove.

In the following an approach will be described for forming on a substrate a pattern of a material that, in general, cannot be applied to the substrate directly due to the fact that the material cannot be printed and/or has no or reduced adherence properties with respect to the substrate. An example of such material, on the basis of which tests have been carried out, are carbon nanotubes which, in an LEP process, can be charged to adhere to the photo imaging plate and to the blanket. However, they will not adhere to a substrate, like paper. For such materials, the subsequently described approach allows the transfer of a pattern of such a material to the substrate despite the fact that it cannot be printed and/or has no or reduced adherence properties. The material is provided with an adhesive layer, for example a transparent LEP ink, and the pattern with adhesive ink applied thereto is transferred to the substrate so that the material is fixed to the substrate by means of the adhesive material. Also materials which are not desired to be conditioned or modified can be applied to the substrate, e.g. a material which does not provide for the possibility of being combined with polymer materials or other materials for introducing an adherence property in the material.

When considering the field of LEP printing, the LEP process allows reliably transferring a variety of materials to a substrate at a good quality. However, there are materials which may create a background image on the respective drums of the LEP apparatus and/or on the printed substrate. Other materials may not be dielectric enough for being transferred electrically by the electric field to the photo imaging plate of the LEP apparatus, thereby resulting in a poor quality of the printed image. Other materials may not be reliably transferred onto the substrate due to their low adherence property to the substrate.

The just mentioned materials, by means of the subsequently discussed approach, can also be applied in a desired pattern onto a substrate.

In an example a wide range of materials may be printed by LEP-based presses by making use of the LEP ink, which becomes a sticky polymer layer ("glue") when heated. The required material in a dispersed form is applied, and sticks to the patterned "glue" layer. This capability enables LEP-based presses to print many types of materials including decorative materials such as decorative flakes, ceramic materials, pharmaceuticals, and functional materials as conductors and semi-conductors.

FIG. 1 is a schematic diagram of an LEP (Liquid Electro Photography) print engine, e.g. an HP Indigo print engine. The LEP process is described with respect to the print engine of FIG. 1. A photoconductor 10 (PIP—photo imaging plate) is charged by a charge roller 12. A laser writing head 14 (WH—writing head) discharges the required image pattern onto the PIP 10 (forming of a latent image), followed by an electrical transfer of charged LEP ink from one of the Binary Ink Development (BID) units 16a-16g onto the discharged regions of the PIP 10. The ink is then transferred to the blanket (ITM—intermediate) drum 18 where it undergoes drying and softening-melting using both internal and external heaters 20. The dry-melted ink emerges from the ITM drum 18 as a tacky film similar to "hot melt glue" and finally the ink is pressed onto a media received between the ITM drum and the impression (IMP) drum 22 and adheres to it.

The resin in the ink allows printing on almost any substrate. This property of the ink (printable on almost any substrate) allows making most materials adhere to the resin. This character of LEP ink to behave as glue may be exploited for printing "non-printable" materials. The ability to print "non-printable" materials may increase the attractiveness of any printing system, and the applications may range from attractive graphics enhancement features (e.g. glittering materials) to functional printing (e.g. printed electronics). The possibility of low-cost layering of functional materials as variable structures allows creating inexpensive devices for low-cost applications such as RFIDs (Radio Frequency IDentification), LEDs (Light Emitting Diode) or solar cells.

Figure 2:
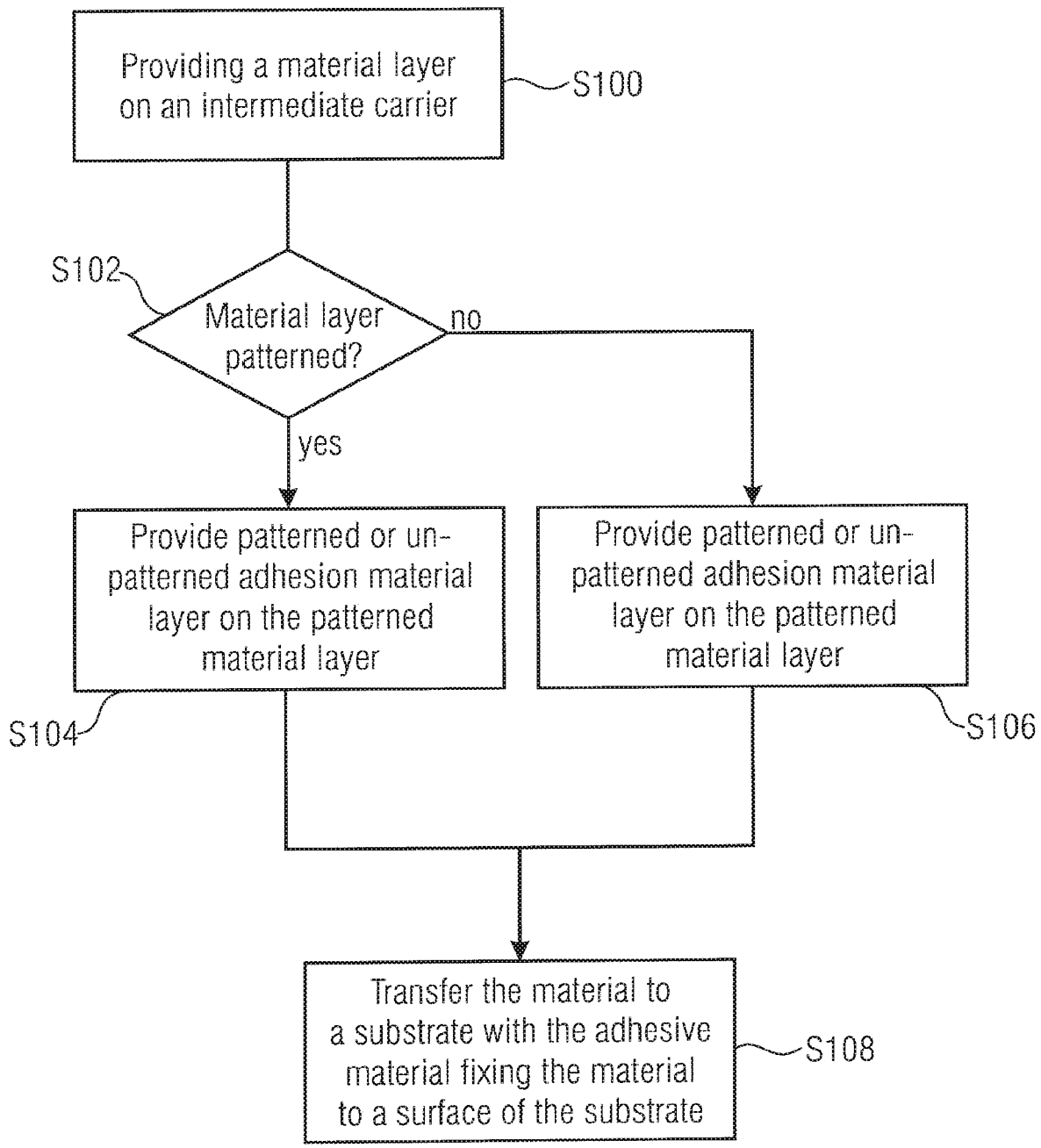
FIG. 2 is a flow diagram describing an example of a method for forming on a substrate a pattern of a material.

FIG. 2 is a flow diagram describing an example of the method for forming on a substrate an image or a pattern of a material. In a first step S100 a layer of the desired material is provided on an intermediate carrier. It is then determined whether the material layer is provided in a pattern or not, as is depicted in step S102. In case the material layer is provided in a pattern corresponding to the pattern to be transferred to the substrate, an adhesive or adhesion material layer is provided on the patterned material layer in step S104. The adhesive material layer may be not patterned, i.e. may be applied over substantially the entire surface of the intermediate carrier, or it may be patterned with a pattern substantially corresponding to the pattern of the material layer so that the material to be applied to the substrate with the desired pattern is covered substantially by the adhesive material layer. In case the material layer is not patterned, in step S106 the adhesive material layer is provided with a pattern on the unpatterned material layer, wherein the pattern of the adhesive material layer corresponds to the pattern of the material to be applied to the substrate. In step S108 the material is transferred to the substrate with the adhesive material fixing or "gluing" the material to a surface of the substrate.

In an example, the process may include a digital printing process, such as inkjet printing, LEP printing, or dry EP printing without the requirement of providing any foils or a hot foiling process for fixing the pattern or image between the substrate and the foil.

In an example, a blanket drum and an impression drums of an LEP apparatus are used in an alternate way, and an LEP ink is the adhesive (glue) material that may not just be applied via the photo imaging plate drum, but by any other digital method (e.g. inkjet printing on a blanket) or digital printing solution, which is able to print variable images.

The material may be any material that cannot be reliably printed and/or transferred onto the substrate and/or does not reliably adhere to the substrate after being applied thereto. Examples of such materials are conductive materials, like carbon nanotubes, metallic materials or, in general, materials difficult to apply to the substrate using one of the above described techniques.

The material layer may be provided on the intermediate carrier by one of the above mentioned techniques for obtaining the desired pattern in case a patterned material layer is to be provided. Alternatively, for example when the material cannot be applied or is difficult to apply by one of the above mentioned techniques, an unpatterned layer of the material is applied to the intermediate carrier and the desired pattern is generated by applying the adhesive material with the desired pattern.

The approach is advantageous as it allows to apply substantially any material to a substrate in a desired pattern without the need to modify or optimize the material for a specific printing technique. Substantially no limitations with regard to the size, conductivity or the like exist, rather, the material can be used as it is, thereby avoiding any changes in specific properties of the material after applying it to the substrate due to the conditioning thereof. It is no longer needed to create a tacky adhesive film including the material or payload, for example by providing metallic particles with a high pigment loading for making the particles printable using inkjet technology, rather, the metallic particles can be used as they are without any need for conditioning them for printing onto the substrate in the desired pattern. When considering the LEP technology, for printing via the blanket roller in the LEP apparatus the payload material needs to be transferable to the blanket, and then from the blanket to the substrate. Not all materials have this property, however, by applying the above approach any material can be printed and as an adhesive material layer an LEP ink, for example a transparent ink or pigmented ink or ink containing some functional material. The adhesive may be any kind of standard or non-standard ink including one created of functional material, may be used which is very adhesive and will glue the material to the substrate.

FIG. 3 shows various examples for transferring a material with a desired pattern to a substrate when applying a method as described above with regard to FIG. 2. FIG. 3(a) shows at a first position an intermediate carrier 100 on one surface 102 of which a patterned material layer 104 has been applied, for example by inkjet printing, EP printing, LEP printing or any other suitable method. The material layer 104 is patterned, as can be seen from FIG. 3(a), and the pattern corresponds to the final pattern with which the material is to be applied to the substrate. Further, an adhesive material layer 106 is applied to the material layer 104. The adhesive material layer 106 is patterned with substantially the same pattern as the material layer 104, thereby substantially covering the material 104. The adhesive material layer 106 may be an LEP ink applied by an LEP process to the material layer 104. The intermediate carrier 100 as shown at the first position in FIG. 3(a) is then further processed as is shown at the second position in FIG. 3(a). The intermediate carrier 100 having applied thereto the layers 104 and 106 and a substrate 108 are brought together in such a way that the adhesive material layer 106 and a surface 110 of the substrate 108 contact each other. The intermediate carrier 100 and the substrate 108 may be brought together in such a way that a specific amount of pressure is applied. Due to the contact between the surface 110 of the substrate 108 and the adhesive material layer 106, the adhesive material layer 106 is fixed on the surface 110 of the substrate 108, wherein the strength of the connection between the surface 100 and the adhesive material layer 106 is greater than the connection strength by which the material layer 104 is held on the surface 102 of the intermediate carrier. During the further transfer process, the intermediate carrier 100 and the substrate 108 are separated from each other, as is shown at the third position in FIG. 3(a) and due to the lower strength of the connection between the material layer 104 and the surface 102 of the intermediate carrier 100 when compared to the strength of the connection between the adhesive material layer 106 and the surface 110 of the substrate 108 the layered structure comprising the material layer 104 and the adhesive material layer 106 is removed from the intermediate carrier 100 and remains on the surface 110 of the substrate 108. The substrate 108, now including the desired pattern of the material 104, is shown in the lower part of FIG. 3(a). The material pattern 104 has been transferred to the substrate 108 and is fixed or "glued" to the surface 110 of the substrate 108 by means of the adhesive material 106.

FIG. 3(b) shows a similar process as in FIG. 3(a) and the same reference signs are used. When compared to FIG. 3(a), in FIG. 3(b), as can be seen at the first position, the material layer 104 is not patterned, and it may be applied to a part or to the entire surface of the intermediate carrier 100. This process may be used when it is difficult to apply the material 104 by means of a printing approach as mentioned above. In this situation, it is easier to simply apply the material 104 over the surface of the carrier 100 and to define the pattern to be transferred by a patterned adhesive material layer 106 that may be applied by one of the above mentioned techniques. This allows precisely applying the adhesive material with the desired pattern, for example applying an LEP ink in accordance with the LEP technology. As can be seen at the second and third positions in FIG. 3(b), the transfer process results in a transfer of the patterned adhesive material layer to the surface 100 of the substrate 108 in a way as described above with regard to FIG. 3(a). Also a part 104a of the material layer covered by the adhesive material 106 is transferred, and some 104b of the material remains on the intermediate carrier 100 after the transfer. Thereby the material is transferred with the desired pattern to the substrate, resulting, as is shown in the in the lower part of FIG. 3(b), in the same structure as in FIG. 3(a).

FIG. 3(c) shows yet another possibility for transferring a material with the desired pattern to a substrate. When compared to FIG. 3(a), the difference is that the adhesive material layer 106 is applied without a pattern to substantially cover the entire surface of the intermediate carder 100, thereby covering the carrier's surface 102 and the patterned adhesive material layer 104. This results in a substrate 100 having the material 104 provided thereon in the desired pattern glued to the surface by means of the adhesive material layer 106 now covering substantially the entire surface of the substrate 100.

In FIGS. 2(a) to 2(c) the material layer 104 and the adhesive material layer 106 are provided on the same intermediate carrier 100. However, in accordance with other examples, the material layer 104 may be provided on the intermediate carrier 100, and the adhesive material layer 106 may be provided on a further intermediate carrier. This is described in FIG. 3(d) on the basis of an example for obtaining a substrate with a defined pattern in a way as described with regard to FIG. 3(b). It is, however, noted that the approach described with regard to FIG. 3(d) may also be applied to obtain the intermediate carriers shown at the first positions in FIGS. 2(a) and (c). The intermediate carrier 100 has applied to its surface 102 the non-patterned material layer 104. A further intermediate carrier 112 is provided having applied to its surface 114 the patterned adhesive material layer 106. The intermediate carrier 100 and the further intermediate carrier 112 are brought together in a way as shown at the second position in FIG. 3(d) such that the adhesive material layer 106 contacts the material layer 104. The intermediate carriers 100, 112 are then separated as shown at the third position of FIG. 3(d), thereby obtaining an intermediate layer 100 as the one depicted at the first position of FIG. 3(b), which is then further processed in a way as described with regard to FIG. 3(b) for obtaining the substrate 108 with the pattern of the desired material glued to its surface by means of the adhesive material.

Figure 4:
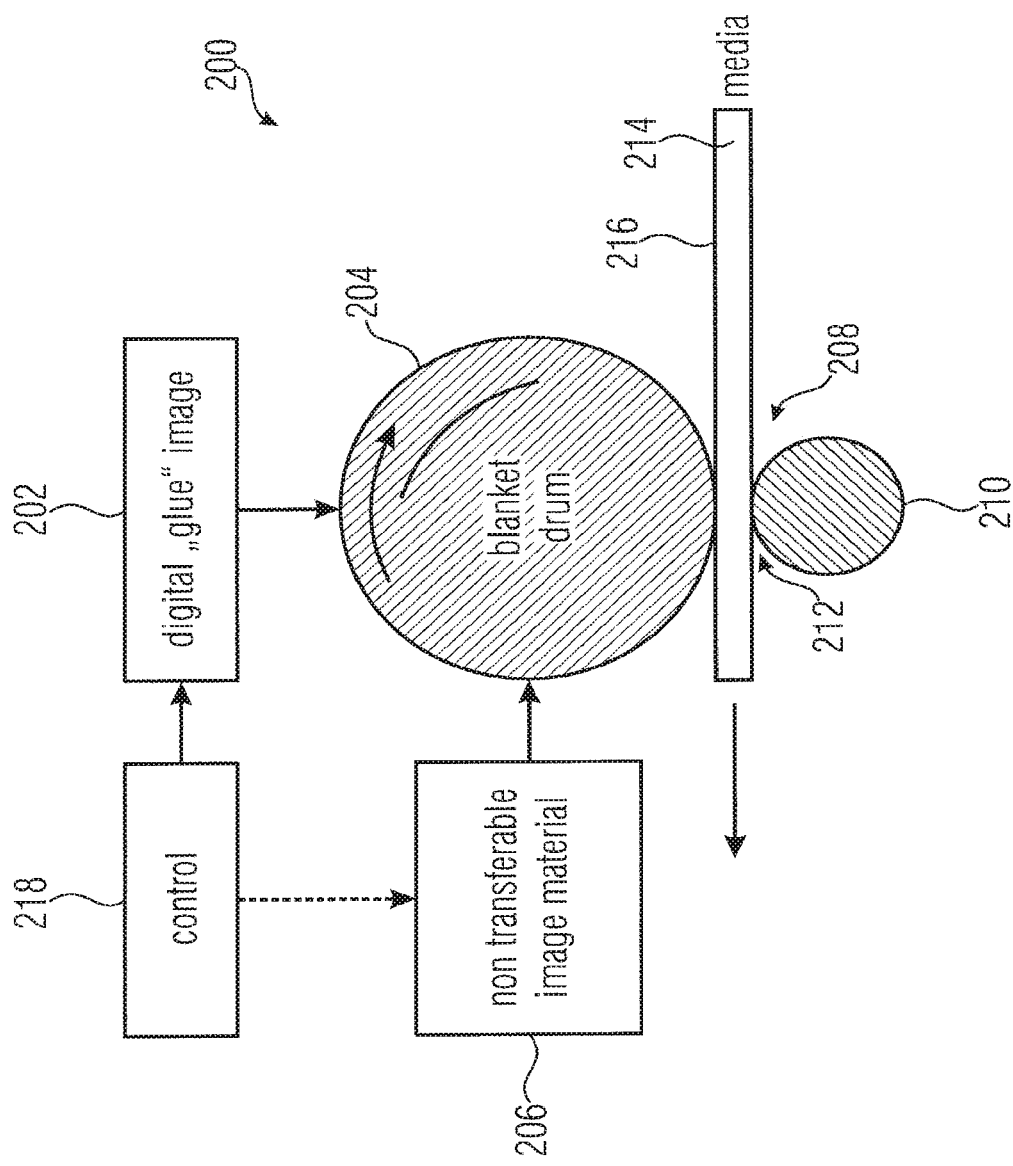
FIG. 4 is a schematic representation of an example of an apparatus for forming on a substrate a pattern of a desired material.

FIG. 4 shows a schematic representation of an apparatus for forming on a substrate a pattern of a desired material. The apparatus 200 includes a print station 202 for printing an adhesive material layer onto a material layer. For example, as described above with regard to FIGS. 2(a) and (b), the print station 202 may be part of an LEP apparatus for applying a transparent LEP ink that fixes or "glues" the material to the substrate after its transfer so that the print station 202, as indicated in FIG. 3, may be considered to apply a "digital glue image". The intermediate carrier 204 is provided with the material layer as is schematically represented by block 206 indicating that the non-transferable image material is applied to the intermediate carrier 204. The intermediate carrier 204, in an example, may be a blanket drum of an LEP apparatus and the block 206 may represent a station suitable for applying either a layer of the material or a patterned layer of the material to the surface of the blanket drum 204. In a way as described above with regard to FIG. 3, by means of the print station 202 the adhesive material is applied to the material layer on the blanket drum 204 and the thus generated two layered structure is forwarded towards the transfer station 208 formed by the blanket drum 204 and a pressure drum 210 defining a nip 212 therebetween for receiving the media or substrate 214, for example a flexible material like paper. As the substrate 214 moves through the nip 212 the layered structure on the surface of the blanket drum 204 is transferred onto the surface 216 of the substrate 214 in a way as described above with regard to FIG. 3.

The apparatus further comprises a control unit 218 controlling the print station 202 and the operation of the other elements of the apparatus. In case block 206 forms a further print station for applying the material image onto the blanket 204, the control unit 218 is also used for controlling this further print station 206, as is depicted by the dotted arrow line in FIG. 4.

The control unit 218 may cause the print mechanism 206 to print the material layer with a pattern in accordance with the pattern to be formed on the substrate 214 onto the drum 204, and may cause the print mechanism 202 to print the adhesive material layer with no pattern or with a pattern corresponding to the patterned material layer onto the material layer. Alternatively, the control 218 may control the print mechanism 206 to apply the material layer without a pattern and may control the print mechanism 202 to apply the adhesive material layer to a material in accordance with the pattern to be formed on the substrate 214.

Thus, FIG. 4 shows an approach allowing to handle materials that are difficult to print, e.g. using LEP technology. The material, by means of the print mechanism 206, is placed on the blanket drum 204, for example by analog or digital methods, such as inkjet printing, LEP printing, dry or liquid photographic printing or other suitable means. By means of print station 202 a digital or selective image is printed on top of this material layer, for example by using transparent LEP ink, which adheres to the payload or material layer. The complete image is then transferred to the substrate 214, and the LEP ink, placed above the payload material, adheres to the media 214 creating a printed image with the payload material on top.

In an example, on the hot blanket 204 the payload material may be printed either selectively to form the image pattern (see FIG. 3(a)) or as a uniform film (see FIG. 3(b)). This is done without a transfer to the substrate 214. A polymer material may be printed onto the payload material by the print station 202. The polymer material becomes a "glue", for example when heated on the blanket drum 204. The polymer material may be applied either with the accurate form or pattern corresponding to the image to be printed or with a uniform film. The blanket 204 is then engaged with the media 214 and the polymer film adheres to the substrate or media 214 and to the payload material creating a glue between them, thereby generating the image on the substrate 214 with the payload material on top.

Figure 5:
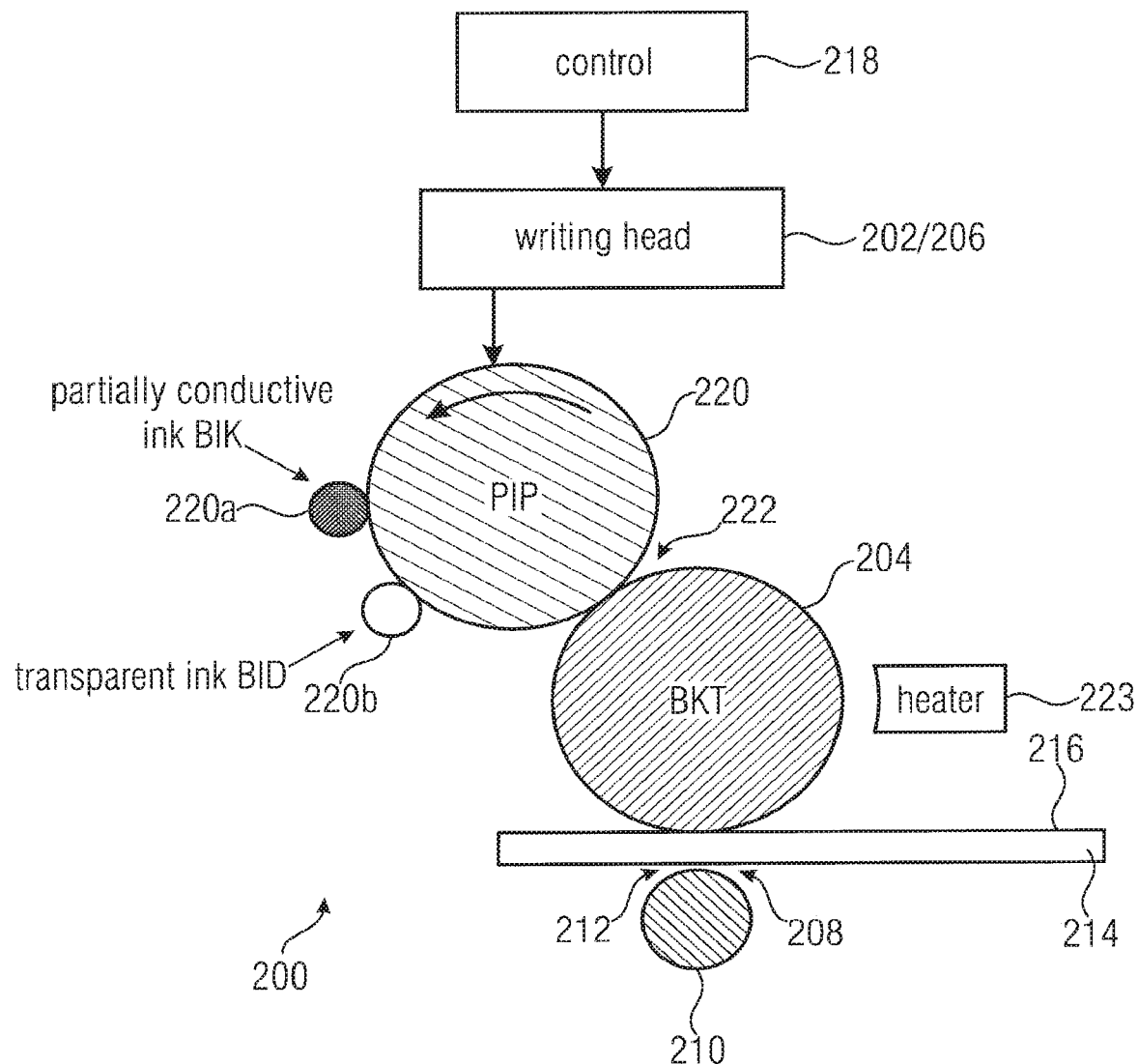
FIG. 5 is a schematic representation of an example of an LEP (Liquid Electro Photography) apparatus for forming on a substrate a pattern of a specific material.

FIG. 5 shows a schematic representation of an LEP apparatus used for forming on a substrate a pattern of a specific material in a way as described above with regard to FIG. 2. In FIG. 5, those elements already described with regard to FIG. 4 have the same reference number and a repeated description thereof is omitted. In addition to the blanket drum 204 a photo imaging plate PIP 220 is provided receiving the conductive ink at respective binary ink developers (BIDs) 220a, 220b arranged along the periphery of the PIP 220. The BID 220a is provided for applying a partially conductive ink onto the PIP 220 which can be handled by the LEP apparatus and can be transferred to the blanket 204, however, the ink is formed from a material which has no or reduced adherence properties on the substrate 214 and therefore it cannot be applied by simply LEP printing it onto the substrate 214. Therefore, the approach as described above with regard to FIGS. 1 and 2 is implemented in the LEP apparatus 200 of FIG. 5 in such a way that by means of a second bit 202b transparent ink or pigmented ink or ink containing some functional material forming the adhesive material layer, is provided. The adhesive may be any kind of standard or non-standard ink including one created of functional material.

By means of the writing head 202/206, the charged PIP 220, which may be negatively charged, is discharged when, for example, a laser beam of the writing head strikes the PIP. The ink is also charged, for example negatively, and is therefore attracted to the discharged portions or areas of the PIP 220. Any image generated by the inks on the PIP 20 is transferred via a further transfer station 222 between the PIP 220 and the blanket drum 204 onto the blanket drum and from there in a way as described above with regard to FIG. 4 to the substrate 214. The apparatus 200 shown in FIG. 5 is operated under the control of the control unit 218. During a first phase, the writing head 202/206 is controlled to apply an image onto the PIP 220 in accordance with the desired pattern of the material layer. In this phase the BID 220a is active for applying the partially conductive ink to the discharged areas of the PIP 220 and for transferring them to the blanket 204 via the transfer area 222. No substrate 214 is present in this phase at the transfer station 208. During a second phase, the writing head 202/206 generates a discharge pattern on the PIP 220 in accordance with the pattern with which the adhesive material layer is to be generated. The adhesive material is provided by the transparent ink or pigmented ink or ink containing some functional material via BID 220b. In the second phase, the transparent ink is transferred onto the material on the blanket 204, thereby generating an intermediate carrier in a way as depicted in FIG. 3 and the layered structure on the blanket drum 204 is transferred onto the substrate 214 applied to the apparatus in the second phase, thereby generating on the substrate 214 the pattern of the material glued to the surface 216 by means of the transparent ink or pigmented ink or ink containing some functional material. The adhesive may be any kind of standard or non-standard ink including one created of functional material.

In the example of FIG. 5, the partially conductive ink may include the material to be printed onto the substrate 214, and the material may be in a phase in which it does not adhere to the substrate 214 but will adhere to the transparent ink. This may be done by significantly reducing the content of resin, for instance the material may have 50% or less of the solids as resin, and the rest can be the material of interest. This allows the ink to be processed in accordance with the LEP process, however the amount of resin is sufficiently low for obtaining the desired property or maintaining the desired property of the material to be applied to the substrate. The modified material is applied to the substrate 204 by the above described approach using the melted layer of resin formed by the LEP ink and arranged between the material of interest and the substrate.

For cleaning purposes a full page may be printed with the transparent ink and transferred to a cheap media, thereby removing possible background images from the respective intermediate carriers 204, 220.

In the example of FIG. 5, the LEP apparatus further includes a heater or dryer 223 for heating up the polymers to a temperature at which they become sticky so as to behave as a glue. Alternatively, the blanket drum 204 may include an internal heater so that the blanket drum 204 is heated from inside.

Figure 6:
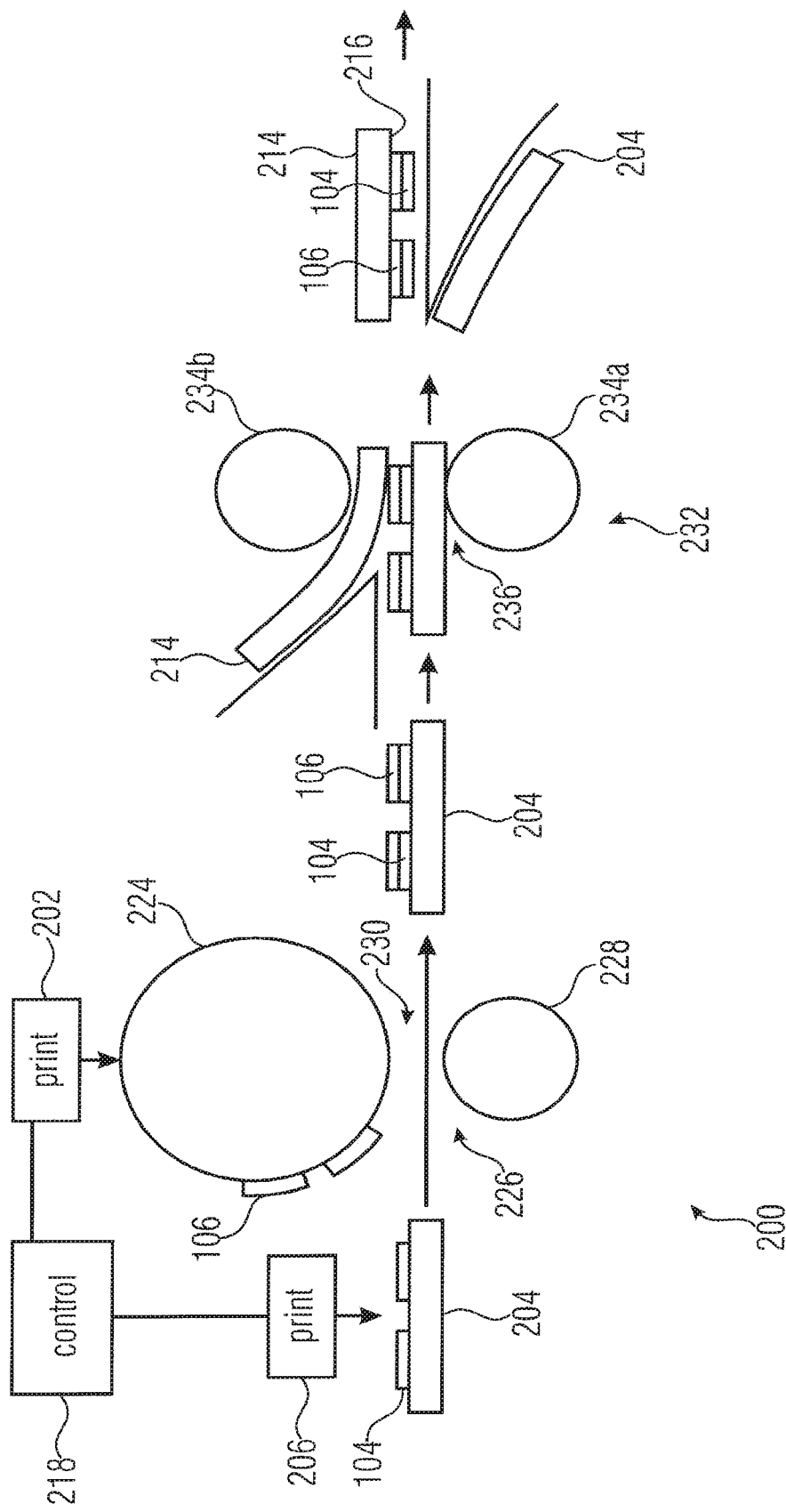
FIG. 6 is another example of an apparatus for forming on a substrate a pattern of a desired material.

FIG. 6 shows another example of an apparatus for forming on a substrate a pattern of a desired material. In FIG. 6, the apparatus 200 receives the intermediate carrier 204 having provided thereon already the adhesive material layer 104 being patterned (as depicted in FIG. 6) or being non-patterned (as described above with regard to FIG. 3). In an example, the apparatus 200 may include a print mechanism 206 operating under control of the control unit 218 for generating the material layer 104 on the intermediate carrier 204. Alternatively, the intermediate layer 204 having applied thereon the material layer 104 may be provided externally and supplied to the apparatus 200. In such an example, no print mechanism 206 is needed. The apparatus 200 comprises a further intermediate carrier 224 on which, by means of the print mechanism 202, the adhesive material layer (patterned as shown in FIG. 6 or unpatterned) is applied. The apparatus comprises a transfer station 226 formed between the further intermediate carrier 224, which may for example be a PIP similar to the one of FIG. 5, and a pressure drum 228. A nip 230 is defined between the drums 224 and 228 and the intermediate carrier 204 having applied thereto the material layer 104 passes through the nip. When passing the nip 230, the adhesive material layer 106 is transferred from the drum 224 onto the material layer 104, thereby yielding the intermediate carrier 204 shown at the center of FIG. 6 having applied thereto the layered structure including the material layer 104 and the adhesive material layer 106. The intermediate carrier 204 is forwarded to a further transfer station 232 defining between two pressure drums 234a and 234b a nip 236. The nip receives the intermediate carrier 204 including the two layers 104 and 106 and the substrate 214, thereby bringing the substrate 214 and the intermediate carrier 204 together such that the adhesive material layer 106 and the surface 216 of the substrate 214 come into contact with each other so that, as described above with regard to FIG. 3, the adhesive material layer 106 will be fixed to the surface 216 of the substrate 214 together with the material 104 as is depicted at the right hand part of FIG. 6. The intermediate layer 204 may be discarded and may be recycled for future use for generating further patterns to be transferred.

Figure 7:
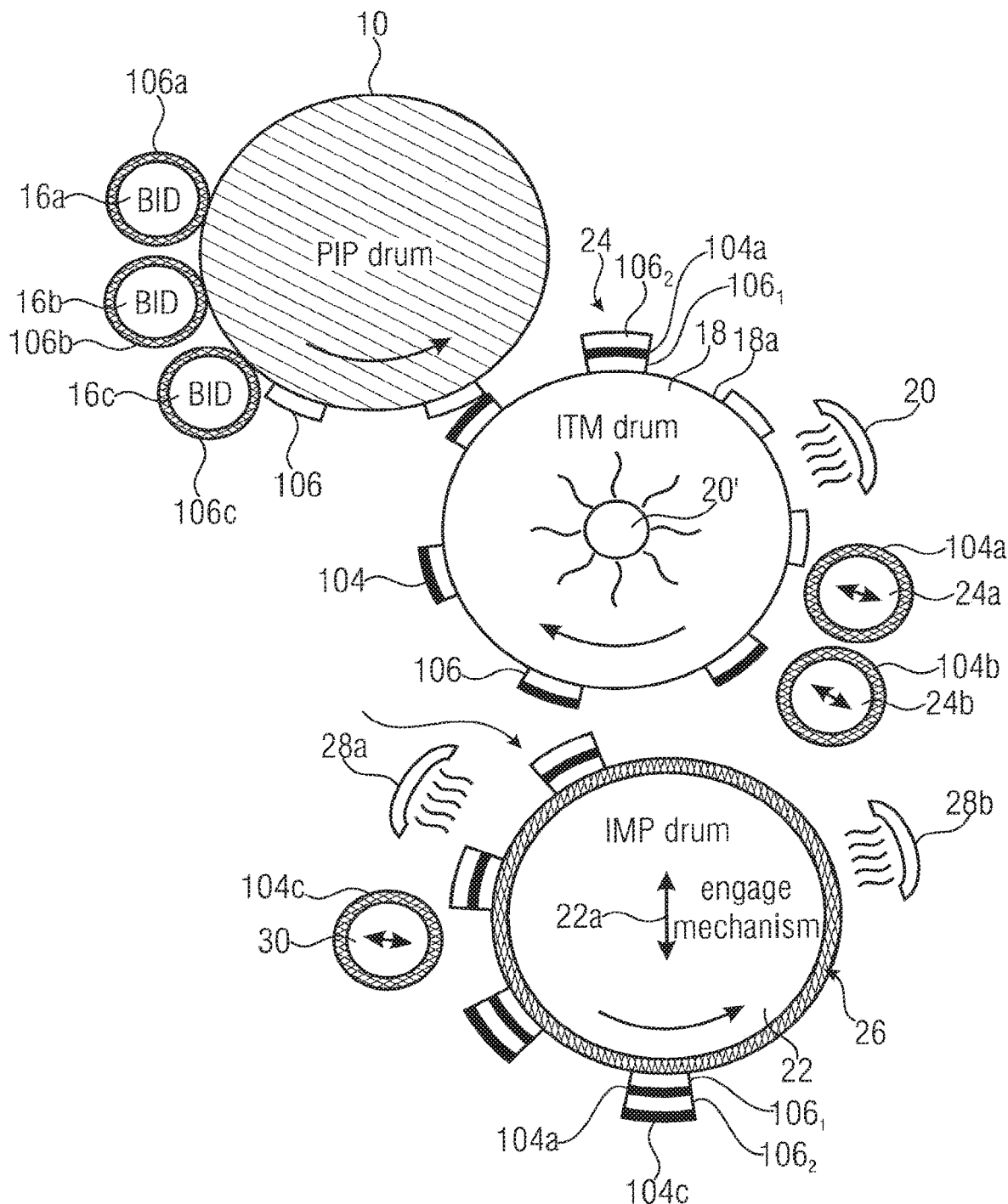
FIG. 7 is a schematic representation of an example of an LEP print engine of FIG. 1 which has been modified for printing any type of material.

FIG. 7 is a schematic representation of an example of an LEP print engine of FIG. 1 which has been modified for printing any type of material. For the sake of clarity the imaging part (charging, writing and cleaning) as described in FIG. 1 is not shown in FIG. 7. The BID units 16a-16c apply LEP ink 106a-106c which may comprise a simple process color (CMYK), a transparent ink, a dielectric ink or functional materials such as semiconductors. LEP-based inks 106a-106c may contain enough resin so they can serve as glue or adhesive. The LEP material 106a-106c is transferred to the ITM drum 18, where it is heated by an external heater 20 and/or an internal heater 20' so that it dries and melts. At the ITM drum 18, there are several applicators 24a, 24b which carry the functional materials 104a, 104b in a dispersed or viscous form on a roller, which is slightly touching the ITM drum 18. The functional material sticks 104a, 104b to the LEP material 106 and not to the ITM drum 18 due to a blanket release layer 18a. Alternatively the functional material 104a, 104b may be charged and an electric field can repel it from the uncoated blanket drum 18. There are several applicators 24a, 24b of functional materials 104a, 104b, with only one of them being engaged with the ITM drum 18 at a time. Below the ITM drum 18 is the IMP drum 22, which can be dynamically engaged and disengaged with the ITM drum 18 using an engage mechanism (see the arrow 22a).

In a first step, the IMP drum 22 is disengaged from the ITM drum 18, and the ITM drum 18 continues to revolve and pick up additional layers of LEP material 106. A layered structure 24 is shown as an example which includes a first layer of LEP material $106_1$ on the ITM drum 18, a second layer of the functional material 104a on the first layer, and a third layer of LEP material $106_2$ on the functional material 104. This may be repeated to create several layers of functional materials "sandwiched" between LEP materials (which can also be functional).

In the next step, the IMP drum 22 engages the ITM drum 18, and the "sandwich" 24 of one functional material is transferred to the IMP drum. The LEP material layer serves as glue, attaching the "sandwich" 24 to a substrate 26 (such as paper or plastic). On the IMP drum 22, the ink 106 may be re-heated by heaters 28a, 28b, to become sticky and to be able to collect additional functional material 104c on top. The additional functional material 104c may be provided by an applicator 30 which carries the functional material 104c in a dispersed or viscous form on a roller, which is slightly touching the IMP drum 22.

In accordance with another example, a functional material applicator for application of the material both on the BKT (blanket) drum 18 and the substrate 26 provided on the IMP drum 22 may be used.

Figure 8:
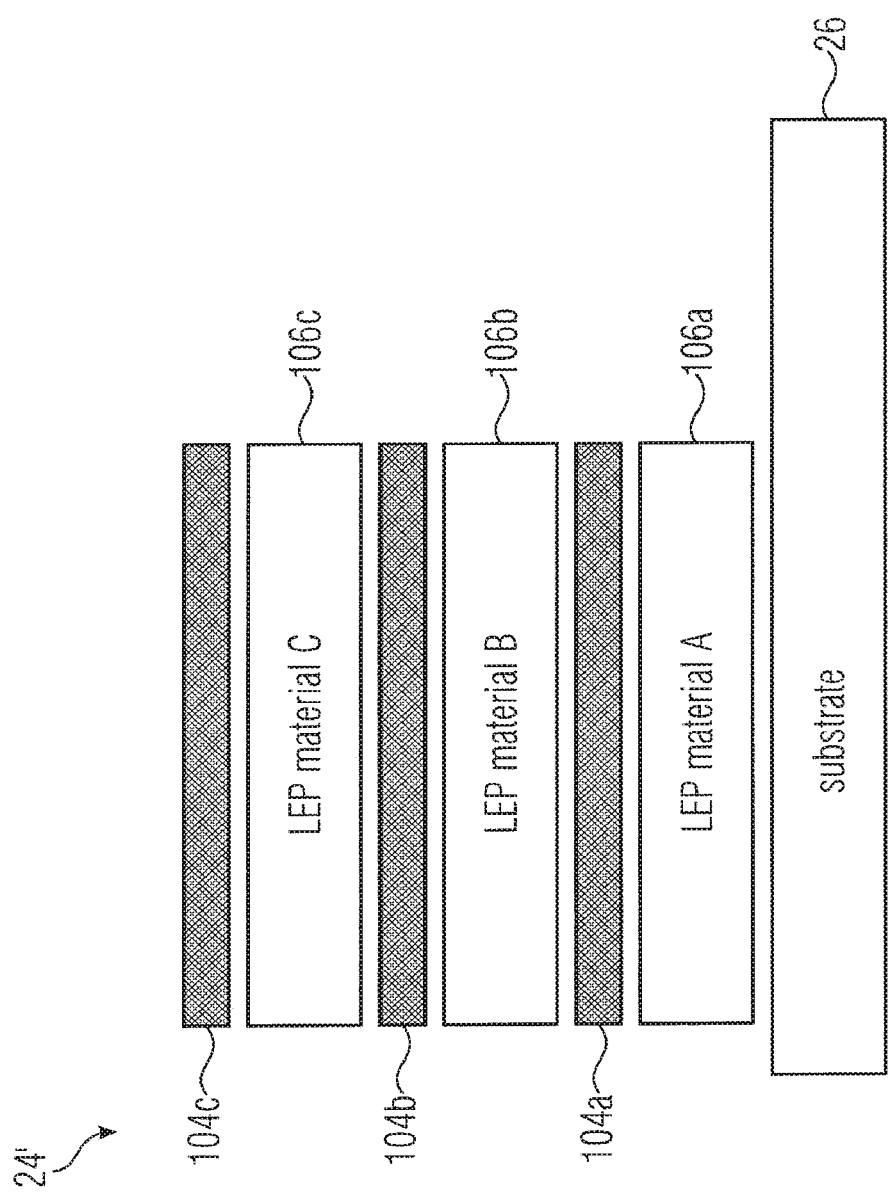
FIG. 8 shows an example of a multi-layer structure made by the printing engine shown in FIG. 7.

FIG. 8 shows an example of a multi-layer structure 24' made by the printing engine shown in FIG. 7. Functional materials 104a, 104b are "sandwiched" among LEP materials A, B and C. LEP Material A attaches the structure 24' to the substrate 26. Functional Material 104c was added in the final step on the IMP drum 22 by applicator 30.

FIG. 9 shows an example of a multi-layer functional device made by the printing engine described with respect to FIG. 7. In this example the functional material layers are conductors and an LEP layer between them may be dielectric, thereby forming a capacitor. In general the LEP layer may be semiconductive or resistive. FIG. 9(a) shows a cross-section of the layers, while FIG. 9(b) shows in 3D the patterned layers one above the other.

The steps to print the device shown in FIG. 9 are as follows: A first layer 106a of LEP material is printed while the IMP drum 22 is engaged, and transferred to the substrate 26. The first layer 106a is heated at the IMP drum 22 and the functional material 104c (a conductor in this example) is glued to the LEP Material 106c. While the IMP drum 22 is still engaged, an LEP dielectric material layer 106b is transferred from the ITM drum 18 over the previous layers 106a, 104c on the substrate 26. The IMP drum 22 is disengaged, and the top LEP Material 106c is formed on the ITM drum 18, collecting onto it the functional material 104b, which is also a conductor according to this example. The IMP drum 22 engages again and both layers 104b, 106c are transferred to the substrate 26, finalizing the capacitor device. In this example device the first and second conductive layers 104b, 104c, at the right side in the Fig., overlay without any material there between so that the material will tend to attach each other to make a continuous conducting path.

Figure 10:
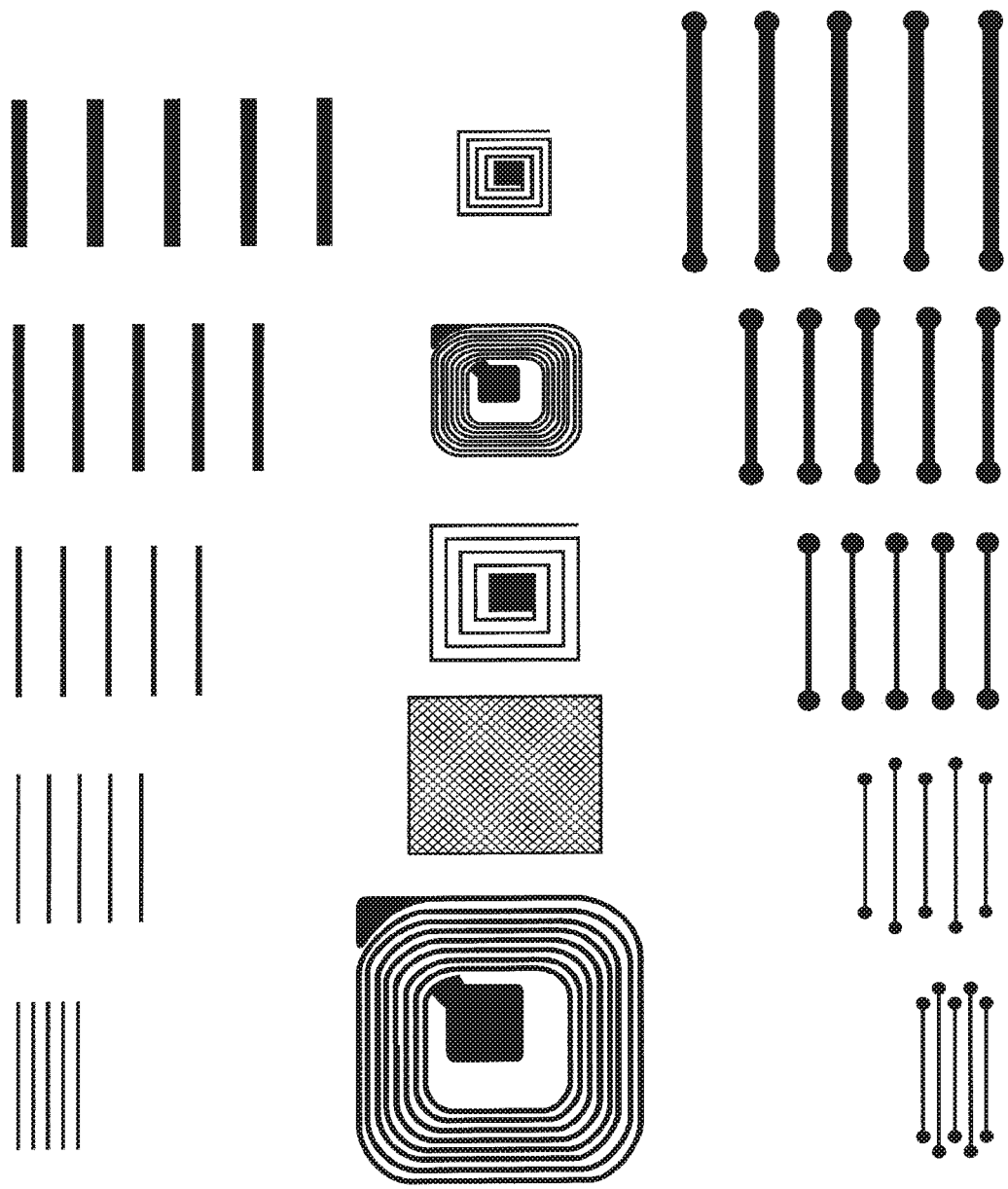
FIG. 10 shows a sample of carbon nanotubes printed on paper using the "gluing" concept.

The pattern to be transferred to the substrate may be used in various fields, for example for generating printed documents like greeting cards or brochures. The process may also be used for generating electrical structures, for example by applying carbon nanotubes on a substrate in a desired pattern. Different circuit patterns were obtained by using carbon nanotube ink in an apparatus as described above. The circuit patterns include different conductive traces, for example conductor lines or spiral conductors that may be used in electrical circuits. The carbon nanotube ink used for generating the patterns have 40% of the solid particles being the resin. This lack of resin results in a lacking or reduced adherence property of the image on the substrate so that the transfer of the image from the blanket to the substrate become possible by the above described approach, which resulted in an image with no background and a desired resistivity of several kΩ/□. FIG. 10 shows a sample of carbon nanotubes printed on paper using the "gluing" concept. An ink including a high percentage (40% of the total solid materials) of carbon nanotubes (CNTs) was printed using the modified print engine of FIG. 7. This ink was able to pass from the PIP drum 10 to the BKT drum 18, creating on the BKT drum 18 an image. Thick CNTs layer are collected on the BKT drum 18, by accumulating 16 layers of ink from the PIP drum 10, with the IMP drum 22 disengaged. Due to the low content of resin the CNTs layer do not transfer and adhere to the substrate 26. The next step is to print the required image pattern with yellow LEP ink. The IMP drum 22 is engaged and the CNTs are transferred to the substrate 26 and adhere to it where the LEP ink is printed. The rest (background) image remains on the BKT drum 18. A cleaner page is finally sent to clean the background image. From FIG. 10 it can be appreciated that the material transfer is very good and without any visible background image.

An example of forming on a substrate a pattern of a material provides a patterned adhesive layer on the intermediate carrier and subsequently transfers a material onto the adhesive layer, e.g. in case the material is not controllable by printing methods, like a powder or a viscous material which is not chargeable or jetable etc.

An example may alternatingly apply the adhesive and the material (e.g. a different material and/or a different adhesive during each stage) on an intermediate drum and finally transfer the stack onto the substrate. This allows creating a device with many layers. Alternatively, the layers of adhesive and material may be applied layer after layer onto the substrate. As a further alternative, a first part of the stack may be created on the intermediate carrier and transferred to the substrate and then further layers may be applied to the stack on substrate.

An example may form a structure on the substrate where the adhesive is on the top, and then a material may be adhered onto the exposed adhesive.

The adhesive and the material may be applied with varying dimensions and/or positions per element (e.g. for forming a device with a block in the middle and a strip on the top and bottom).

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above description is merely illustrative for the principles of the method and apparatus for forming on a substrate a pattern of a material. It is understood that modifications and variations of the arrangements and the details described herein will be apparent to others skilled in the art. It is the intent, therefore, to be limited by the scope of the impending patent claims and not by the specific details presented by way of description and explanation herein.

The invention claimed is:

1. A method for forming a pattern of a material on a substrate, the method comprising:
    providing a continuous material layer of dry particles;
    jetting adhesive to form an adhesive layer on the layer of particles, wherein either the material layer of dry particles or the adhesive layer is formed in a pattern corresponding to the pattern of material to be formed on the substrate;
    consolidating the material layer using heat and pressure; and
    transferring the material layer to the substrate with the adhesive layer fixing the material layer to a surface of the substrate.

2. The method of claim 1, wherein the material layer of dry particles is formed in the pattern corresponding to the pattern of material to be formed on the substrate.

3. The method of claim 1, wherein the adhesive layer is formed in the pattern corresponding to the pattern of material to be formed on the substrate.

4. The method of claim 1, wherein the pattern corresponds to a conductive pattern to be formed on the substrate.

5. The method of claim 4, wherein the material layer of dry particles is formed according to the pattern.

6. The method of one claim 5, wherein providing a first patterned material layer comprises printing a functional material on an intermediate carrier.

7. The method of claim 6, wherein transferring the first patterned material layer to the substrate comprises bringing together the intermediate carrier and the substrate such that the adhesive layer on the material layer comes into contact with a surface of the substrate.

8. The method of claim 1, wherein the material layer transferred is a first patterned material layer and the method further comprises:
    providing a second patterned material layer comprising a second pattern corresponding to a second, semiconductor pattern to be transferred onto the first patterned material layer; and
    transferring the second patterned material layer onto the first patterned material layer to form a multiple layer device wherein the adhesive fixes the second patterned material layer to the first patterned material layer, wherein the second patterned material layer is a semiconductor.

9. The method of claim 8, wherein the second patterned material layer is printed by LEP printing.

10. The method of claim 1, wherein the adhesive comprises a pigmented ink.

11. An apparatus for forming a pattern of a material on a substrate, the apparatus comprising:
    a first station to form a continuous material layer of dry particles;
    a print station to jet adhesive to form an adhesive layer on the layer of particles, wherein either the material layer of dry particles or the adhesive layer is formed in a pattern corresponding to the pattern of material to be formed on the substrate; and
    a transfer station to transfer the material layer to the substrate with the adhesive layer fixing the material layer to a surface of the substrate.

12. The apparatus of claim 11, wherein the first station comprises a dry electro photographic (EP) printing station.

13. The apparatus of claim 11, further comprising a heater to heat the material layer of dry particles.

14. The apparatus of claim 11, wherein first station is to form the material layer of dry particles in the pattern corresponding to the pattern of material to be formed on the substrate.

15. The apparatus of claim 11, wherein the print station is to form the adhesive layer the pattern corresponding to the pattern of material to be formed on the substrate.

16. An apparatus for forming on a substrate a pattern of a desired material, the apparatus comprising:
    a print station to jet an adhesive layer onto a material layer of dry particles that is provided to the print station on an intermediate carrier, wherein at least one of the material layer or the adhesive layer comprises a pattern corresponding to the pattern to be formed on the substrate; and
    a transfer station to receive the substrate and transfer the material layer to the substrate with the adhesive fixing the material to a surface of the substrate.

17. The apparatus of claim 16, wherein the print station comprises a first print mechanism to apply the material layer on the intermediate carrier, and a second print mechanism to apply the adhesive on the material layer.

18. The apparatus of claim 16, wherein the print station comprises a first print mechanism to apply the material layer on the intermediate carrier, and a second print mechanism to apply the adhesive layer to a further intermediate carrier, and wherein the apparatus comprises a further transfer station to transfer the adhesive layer from the further intermediate carrier onto the material layer on the intermediate carrier.

19. The apparatus of claim 18, comprising a control unit, the control unit being to:

cause the first print mechanism to print the material layer with a pattern in accordance with the pattern to be formed on the substrate, and cause the second print mechanism to print the adhesive layer with no pattern or with a pattern corresponding substantially to the patterned material layer, or cause the first print mechanism to print the material layer with no pattern, and cause the second print mechanism to print the adhesive layer with a pattern in accordance with a pattern to be formed on the substrate.

20. The apparatus of claim 16, comprising an LEP press comprising:

a photo imaging plate;

a blanket; and an impression element, wherein the print station comprises a writing head to write an image onto the photo imaging drum, a first binary ink developer to apply an ink including the material onto the photo imaging drum, and a second binary ink developer to apply a transparent ink or pigmented ink or ink containing a functional material onto the photo imaging drum, wherein the LEP press is operable to transfer a material image and a transparent ink image from the photo imaging plate to the blanket, and wherein the transfer station comprises the blanket and the impression element to receive the substrate there between, the LEP press being operable to transfer a two layer image on the blanket to the substrate.

* * * * *